United States Patent
Mori et al.

(10) Patent No.: US 11,557,747 B2
(45) Date of Patent: Jan. 17, 2023

(54) DISPLAY DEVICE

(71) Applicant: Tianma Japan, Ltd., Kanagawa (JP)

(72) Inventors: Shigeru Mori, Kanagawa (JP); Keita Hamada, Kanagawa (JP)

(73) Assignees: WUHAN TIANMA MICRO-ELECTRONICS CO., LTD., Wuhan (CN); TIANMA JAPAN, LTD., Kanagawa (JP)

( * ) Notice: Subject to any disclaimer, the term of this patent is extended or adjusted under 35 U.S.C. 154(b) by 0 days.

(21) Appl. No.: 16/681,250

(22) Filed: Nov. 12, 2019

(65) Prior Publication Data
US 2020/0152915 A1   May 14, 2020

(30) Foreign Application Priority Data

Nov. 12, 2018 (JP) .............................. JP2018-212185
Jul. 22, 2019 (JP) .............................. JP2019-134702

(51) Int. Cl.
 *H01L 51/52* (2006.01)
 *H01L 27/32* (2006.01)
 *H01L 51/56* (2006.01)

(52) U.S. Cl.
 CPC ...... *H01L 51/5265* (2013.01); *H01L 27/3211* (2013.01); *H01L 51/5218* (2013.01); *H01L 51/56* (2013.01); *H01L 27/3244* (2013.01); *H01L 2251/5315* (2013.01)

(58) Field of Classification Search
 CPC ............. H01L 51/5265; H01L 51/5262; H01L 51/5218; H01L 51/5271; H01L 2251/5315
 See application file for complete search history.

(56) References Cited

U.S. PATENT DOCUMENTS

| | | | |
|---|---|---|---|
| 6,406,801 B1 | 6/2002 | Tokito et al. | |
| 2003/0034938 A1* | 2/2003 | Yamada | H01L 51/5265 345/76 |
| 2007/0069996 A1* | 3/2007 | Kuba | H01L 27/3211 345/76 |
| 2007/0252520 A1* | 11/2007 | Hasegawa | H01L 27/3211 313/504 |
| 2011/0096540 A1 | 4/2011 | Oda | |
| 2012/0092872 A1* | 4/2012 | Yoshioka | H01L 51/5265 362/293 |

(Continued)

FOREIGN PATENT DOCUMENTS

| | | |
|---|---|---|
| JP | 2011-096379 | 5/2011 |
| JP | 2018-190666 | 11/2018 |
| WO | WO 2013/179536 | 12/2013 |

*Primary Examiner* — John A Bodnar
(74) *Attorney, Agent, or Firm* — Nixon & Vanderhye

(57) ABSTRACT

A display device includes a substrate and a plurality of first light-emitting elements having a microcavity structure on the substrate. Each of the plurality of first light-emitting elements includes a first light-emitting film and a first upper electrode and a first lower electrode sandwiching the first light-emitting film. The peak wavelength of an emission spectrum of the first light-emitting film is in a wavelength range where the luminosity curve slopes negatively. Within a wavelength range where the peak wavelength of a multiple interference spectrum caused by the microcavity structure varies when the viewing angle varies from 0° to 60°, the luminosity curve slopes negatively, and the emission spectrum slopes positively.

10 Claims, 11 Drawing Sheets

(56) References Cited

U.S. PATENT DOCUMENTS

| | | | | |
|---|---|---|---|---|
| 2013/0045553 A1* | 2/2013 | Fukuda | ............... | H01L 51/5265 257/E33.069 |
| 2013/0193419 A1* | 8/2013 | Mizuno | ............... | H01L 51/5271 257/40 |
| 2015/0187847 A1* | 7/2015 | Choi | ................... | H01L 27/3211 257/40 |
| 2015/0287920 A1 | 10/2015 | Nagaoka et al. | | |
| 2016/0103516 A1* | 4/2016 | An | ........................ | G06F 3/0412 345/174 |

\* cited by examiner

DISPLAY DEVICE

CROSS-REFERENCE TO RELATED APPLICATIONS

This Non-provisional application claims priority under 35 U.S.C. § 119(a) on Patent Application No. 2018-212185 filed in Japan on Nov. 12, 2018 and Patent Application No. 2019-134702 filed in Japan on Jul. 22, 2019, the entire contents of which are hereby incorporated by reference.

BACKGROUND

This disclosure relates to a display device.

The organic light-emitting diode (OLED) element is a current-driven self-light-emitting element and therefore, eliminates the necessity of backlight. In addition to this, the OLED element has advantages for achievement of low power consumption, wide viewing angle, and high contrast ratio; it is expected to contribute to development of flat panel display devices.

An OLED element having a top-emission structure exhibits higher luminous efficiency than an OLED element having a bottom-emission structure. To attain higher luminous efficiency, a microcavity structure is known that utilizes the optical resonant effect between the upper electrode and the lower electrode.

In a top-emission microcavity structure, the anode electrode is made of a reflective material and the cathode electrode is made of a semi-reflective and semi-transparent material, such as MgAg. The resonant effect (cavity effect) that resonates light at a specific wavelength within the OLED element to increase the luminance can be attained by adjusting the film thicknesses in the OLED element. The microcavity structure selectively resonates and amplifies light having a specific wavelength and diminishes light having the other wavelengths. As a result, the luminance and the color purity increase.

Meanwhile, it is known that, in the case of a top-emission microcavity structure in which a cap layer in contact with air is provided over the cathode electrode, the chromaticity and the luminance change significantly depending on the viewing angle but high front luminance is attained because the light extraction efficiency improves. This is described in [0012] of JP 2018-190666 A, for example. This phenomenon occurs because the cap layer has a refractive index higher than that of the cathode electrode thereunder as described in [0006] in WO 2013/179536 A. Therefore, when the refractive index of the cap layer is higher, higher front luminance is attained although the dependency on the viewing angle increases.

SUMMARY

A display device according to an aspect of this disclosure includes a substrate and a plurality of first light-emitting elements having a microcavity structure on the substrate. Each of the plurality of first light-emitting elements includes a first light-emitting film and a first upper electrode and a first lower electrode sandwiching the first light-emitting film. The peak wavelength of an emission spectrum of the first light-emitting film is in a wavelength range where the luminosity curve slopes negatively. Within a wavelength range where the peak wavelength of a multiple interference spectrum caused by the microcavity structure varies when the viewing angle varies from 0° to 60°, the luminosity curve slopes negatively, and the emission spectrum slopes positively.

It is to be understood that both the foregoing general description and the following detailed description are exemplary and explanatory and are not restrictive of this disclosure.

EMBODIMENTS

Hereinafter, embodiments of this disclosure will be described with reference to the accompanying drawings. It should be noted that the embodiments are merely examples to implement this disclosure and are not to limit the technical scope of this disclosure.

Overall Configuration

In the following, an organic light-emitting diode (OLED) display device is described as an example of a display device.

Figure 1:
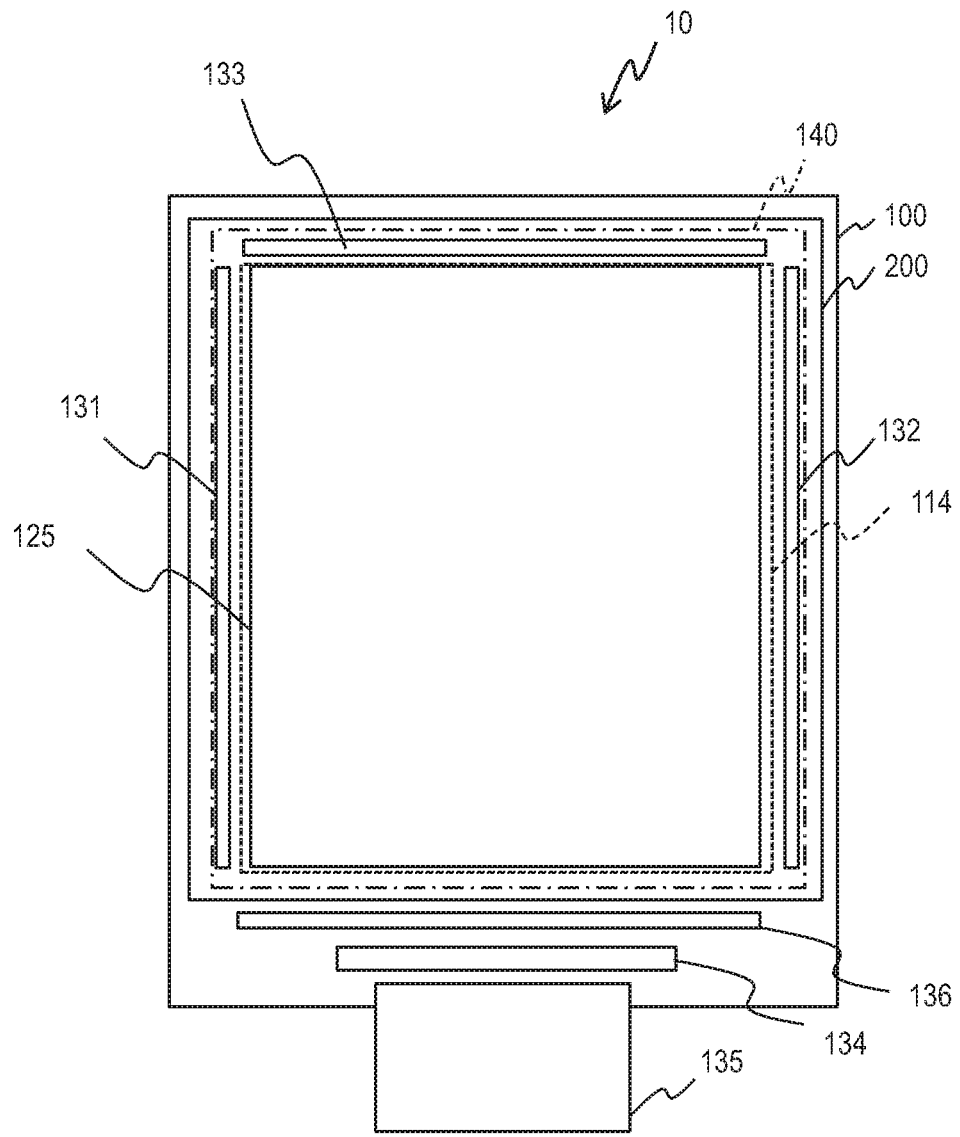
FIG. 1 schematically illustrates a configuration example of an OLED display apparatus.

FIG. 1 schematically illustrates a configuration example of an OLED display device 10. The OLED display device 10 includes a thin film transistor (TFT) substrate 100 on which OLED elements (light-emitting elements) are formed, an encapsulation substrate 200 for encapsulating the OLED elements, and a bond (glass frit sealer) 140 for bonding the TFT substrate 100 with the encapsulation substrate 200. The space between the TFT substrate 100 and the encapsulation substrate 200 is filled with dry air and sealed up with the bond 140.

In the region outer than the display region 125 of the TFT substrate 100, a scanning driver 131, a control driver 132, a protection circuit 133, a driver IC (driver circuit) 134, and a demultiplexer 136 are provided to surround a cathode electrode region 114. The protection circuit 133 protects the elements from electrostatic discharge. The driver IC 134 is connected to the external devices via flexible printed circuits (FPC) 135.

The scanning driver 131 drives scanning lines on the TFT substrate 100. The control driver 132 drives emission control lines or reset control lines to control or reset the light emission periods of subpixels. The driver IC 134 is mounted with an anisotropic conductive film (ACF), for example.

The driver IC 134 provides power and timing signals to the scanning driver 131 and the control driver 132 and further, provides power and a data signal to the demultiplexer 136.

The demultiplexer 136 outputs output of one pin of the driver IC 134 to d data lines in series (d is an integer more than 1). The demultiplexer 136 changes the output data line for the data signal from the driver IC 134 $d$ times per scanning period to drive d times as many data lines as output pins of the driver IC 134. The data lines transmit control signals (data voltages) for controlling driving transistors of the OLED elements.

Structure of OLED Element

Figure 2:
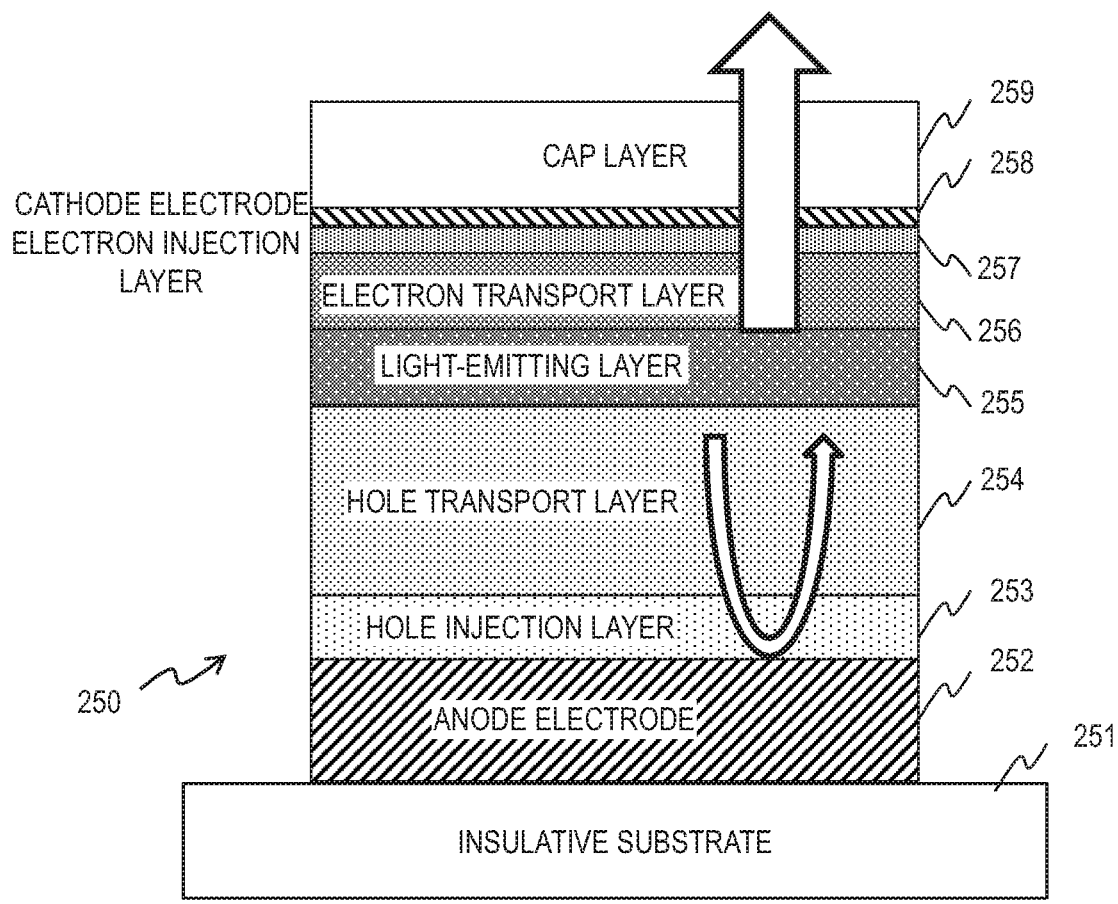
FIG. 2 is a cross-sectional diagram of an OLED element for illustrating an example of its structure.

FIG. 2 is a cross-sectional diagram of an OLED element 250 for illustrating an example of its structure. The display region 125 includes planarly arrayed multiple colors of OLED elements 250. Typically, the display region 125 includes red, green, and blue OLED elements 250. The OLED elements 250 or their light-emitting regions when viewed planarly (in the vertical direction in FIG. 2) are referred to as subpixels. The OLED elements 250 are included in the TFT substrate 100.

The TFT substrate 100 includes an insulative substrate 251, and a TFT array and OLED elements 250 on the insulative substrate 251. The TFT array is omitted in FIG. 2. The insulative substrate 251 is made of glass or resin, for example, and is flexible or inflexible. The OLED elements 250 have a layered structure. The side closer to the insulative substrate 251 is referred to as lower side and the opposite side as upper side.

Each OLED element 250 includes an anode electrode 252 as a lower electrode. The anode electrode 252 includes a transparent film made of ITO, IZO, ZnO, $In_2O_3$, or the like and a reflective film made of Ag, Mg, Al, Pt, Pd, Au, Ni, Nd, Ir, Cr, or a metallic compound thereof.

The OLED element 250 further includes a cathode electrode 258 as an upper electrode. Commonly, the cathode electrode 258 of an OLED element 250 is a part of a conductive layer covering the entire display region 125. The cathode electrode 258 is formed by vapor-depositing Li, Ca, LiF/Ca, LiF/Al, Al, Mg, or an alloy thereof, for example. If the resistance of the cathode electrode 258 is so high that the uniformity of the emission luminance is impaired, an additional auxiliary electrode layer may be formed of a material for a transparent electrode, such as ITO, IZO, ZnO, or $In_2O_3$. To increase the light extraction efficiency, a cap layer 259 is provided over the cathode electrode 258 by depositing an insulator having a refractive index higher than glass.

The OLED element 250 includes one or more organic layers between the anode electrode 252 and the cathode electrode 258. The example of FIG. 2 includes a hole injection layer 253, a hole transport layer 254, a light emitting layer 255, an electron transport layer 256, and an electron injection layer 257; these are layered in this order from the lowest. The material of the light-emitting layer 255 is different depending on the color of the OLED element 250. The structure in FIG. 2 is an example; one or more of the hole injection layer 253, the hole transport layer 254, the electron transport layer 256, and the electron injection layer 257 can be omitted. Another layer such as an electron blocking layer can be added.

The OLED element 250 is of a top-emission type and further, has a microcavity structure. A top-emission type of OLED element 250 emits light from the opposite side to the insulative substrate 251 (TFT array). The cathode electrode 258 is provided on the side from which the light goes out (the upper side of the drawing). OLED elements having a top-emission structure exhibit higher luminance efficiency than OLED elements having a bottom-emission structure.

In a top-emission type employed microcavity structure, the anode electrode 252 has reflectivity to light and the cathode electrode 258 has semi-transmissivity and semi-reflectivity to light. Part of the light from the light-emitting layer 255 passes through the cathode electrode 258 and the remaining is reflected by the cathode electrode 258. Repetitive reflection between the anode electrode 252 and the cathode electrode 258 amplifies the light having a wavelength equal to the optical distance between the anode electrode 252 and the cathode electrode 258.

The microcavity structure can be configured to selectively resonate and amplify light having a specific wavelength and diminish light having the other wavelengths by adjusting the optical distance (film thickness) between the anode electrode 252 and the cathode electrode 258. Among a red OLED element 250, a green OLED element 250, and a blue OLED element 250, the red OLED element 250 has a largest film thickness and the blue OLED element has the smallest film thickness. The features of this disclosure are applicable to bottom-emission type of OLED elements. A bottom-emission type of OLED element has a semi-transparent and semi-transmissive anode electrode and a reflective cathode electrode; it emits light to the external through the insulative substrate 251.

Relations Among Spectra

Since the optical distance in a microcavity structure varies depending on the output angle of the light with respect to the front of the element, the resonant wavelength or the wavelength of the light to be amplified and extracted to the external varies. For this reason, the microcavity structure tends to exhibit variation in chromaticity and luminance; particularly, the variation is felt large in red color. When the chromaticity and luminance vary sharply with angle (viewing angle) at which the user observes the element, the user notices them easily. This problem becomes weighty in the case where the microcavity structure is applied to a display apparatus.

This embodiment configures a specific color of OLED element 250 in such a manner that the multiple interference spectrum generated by the microcavity structure has a unique relation with the spectrum (internal emission spectrum) generated by the light-emitting layer 255. This configuration eliminates sharp variation in luminance and chromaticity with viewing angle.

The internal emission spectrum is a spectrum (optical characteristic) of the light emitted from the light-emitting layer 255 when extracted without through the microcavity structure. The multiple interference spectrum is a spectrum of the light affected by multiple interference effects in the microcavity structure. As to an OLED element 250 having a microcavity structure, the spectrum (external emission spectrum) of the extracted light or the light observed in the external is determined by multiplying the internal emission spectrum by the multiple interference spectrum.

Figure 3A:
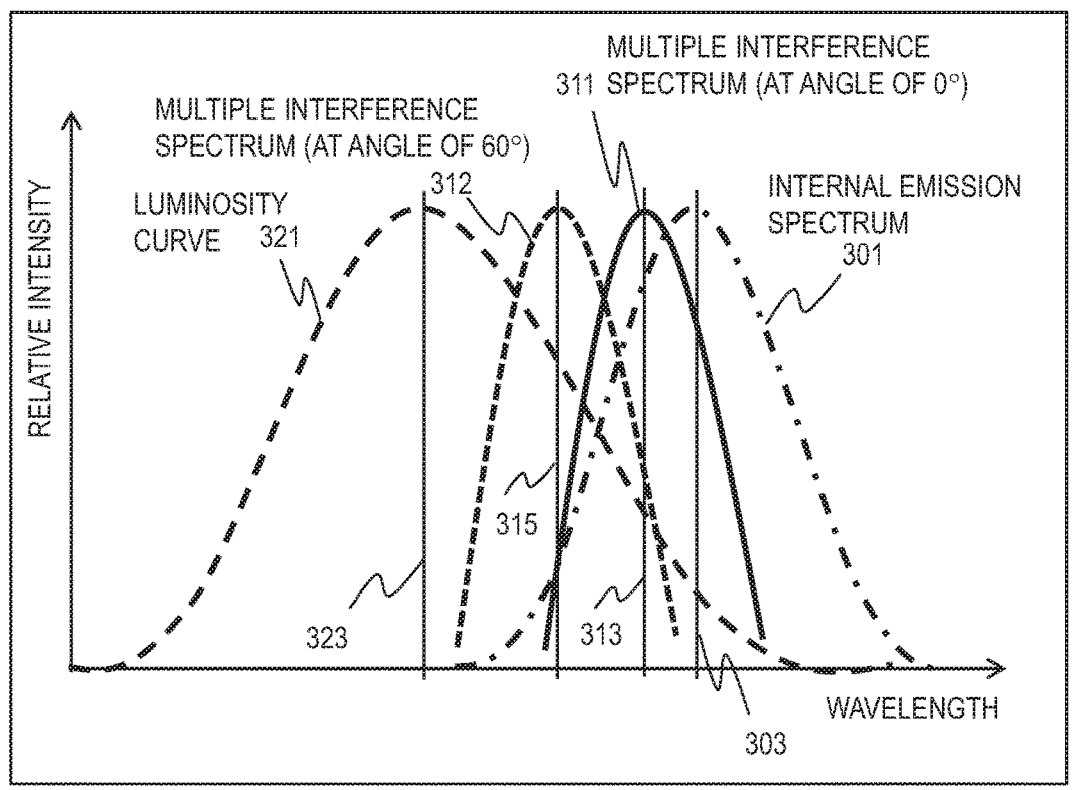
FIG. 3A is a graph indicating a relation among an internal emission spectrum curve of a specific color of an OLED element, multiple interference spectrum curves of the same OLED element caused by a microcavity structure, and the luminosity curve.

FIG. 3A is a graph indicating a relation among an internal emission spectrum curve 301 of a specific color of an OLED element 250, multiple interference spectrum curves 311 and 312 of the same OLED element 250 caused by a microcavity structure, and the standard spectral luminous efficiency curve (hereinafter, simply referred to as luminosity curve) 321. The horizontal axis represents wavelength and the vertical axis represents relative intensity of each curve. The relative intensity is the intensity normalized to the maximum value (defining the maximum value as 1).

The multiple interference spectrum curve 311 represents the spectrum when the viewing angle (hereinafter, also referred to as angle) is 0° (in the direction from the front or in the direction normal to the anode electrode). The multiple interference spectrum curve 312 represents the spectrum when the angle with respect to the front is 60°. The angle of 60° is required for the viewing angle of a common display device. The multiple interference spectrum varies from the multiple interference spectrum curve 311 to the multiple interference spectrum curve 312 as the angle varies from 0° to 60°.

As indicated in FIG. 3A, the wavelength 303 at the peak (the point exhibiting the highest intensity) of the internal emission spectrum curve 301 is longer than the wavelength 323 at the peak of the luminosity curve 321. In the typical combination of red, green, and blue OLED elements 250, the peak wavelength of the internal emission spectrum of a red OLED element 250 is longer than the peak wavelength 323 of the luminosity curve 321.

As further indicated in FIG. 3A, the peak wavelengths (resonant wavelengths) 313 and 315 of the multiple interference spectrum at the angles of 0° and 60° are shorter than the peak wavelength 303 of the internal emission spectrum curve 301. In other words, the peak wavelength of the multiple interference spectrum is shorter than the peak wavelength 303 of the internal emission spectrum curve 301 within the angle range from 0° to 60°.

Figure 3B:
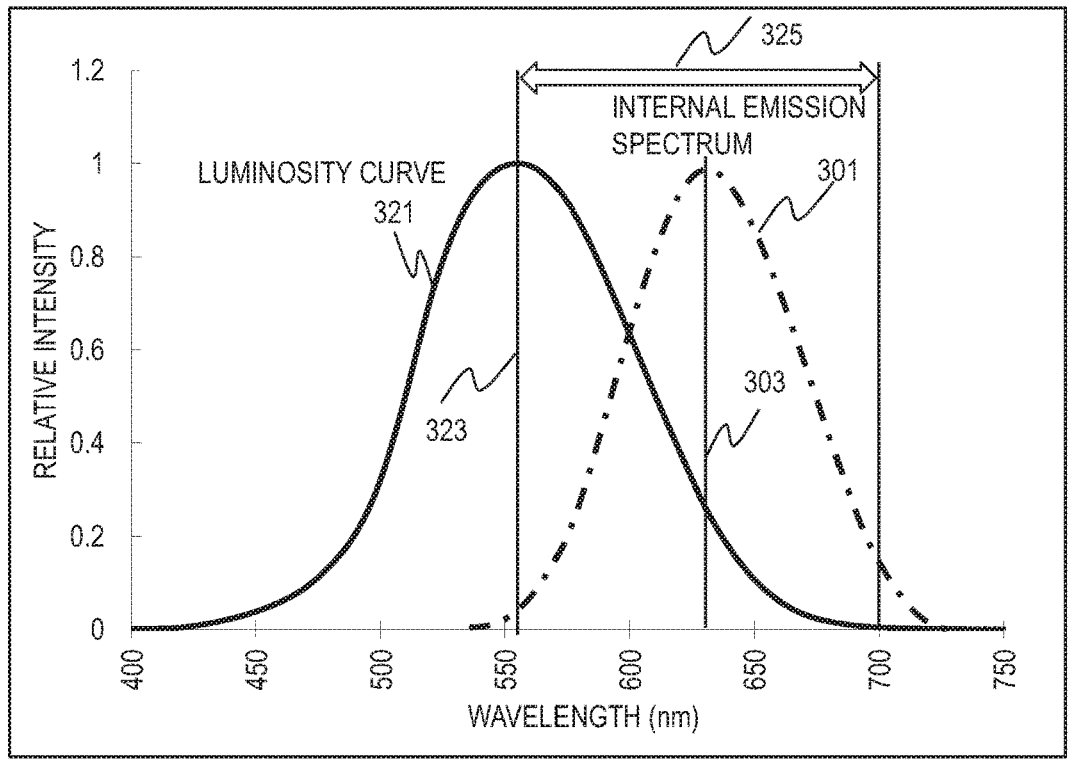
FIG. 3B is a graph indicating the relation between the luminosity curve and the internal emission spectrum curve.

FIG. 3B is a graph indicating the relation between the luminosity curve 321 and the internal emission spectrum curve 301. The horizontal axis represents wavelength and the vertical axis represents relative intensity of the luminosity curve 321 and the internal emission spectrum curve 301. The peak wavelength 303 of the internal emission spectrum curve 301 is in the wavelength range where the luminosity curve 321 slopes negatively (downward) with respect to the wavelength. As described above, the peak wavelength of the internal emission spectrum of a common red OLED element 250 is in the wavelength range 325 where the luminosity curve 321 slopes negatively with respect to the wavelength.

Figure 3C:
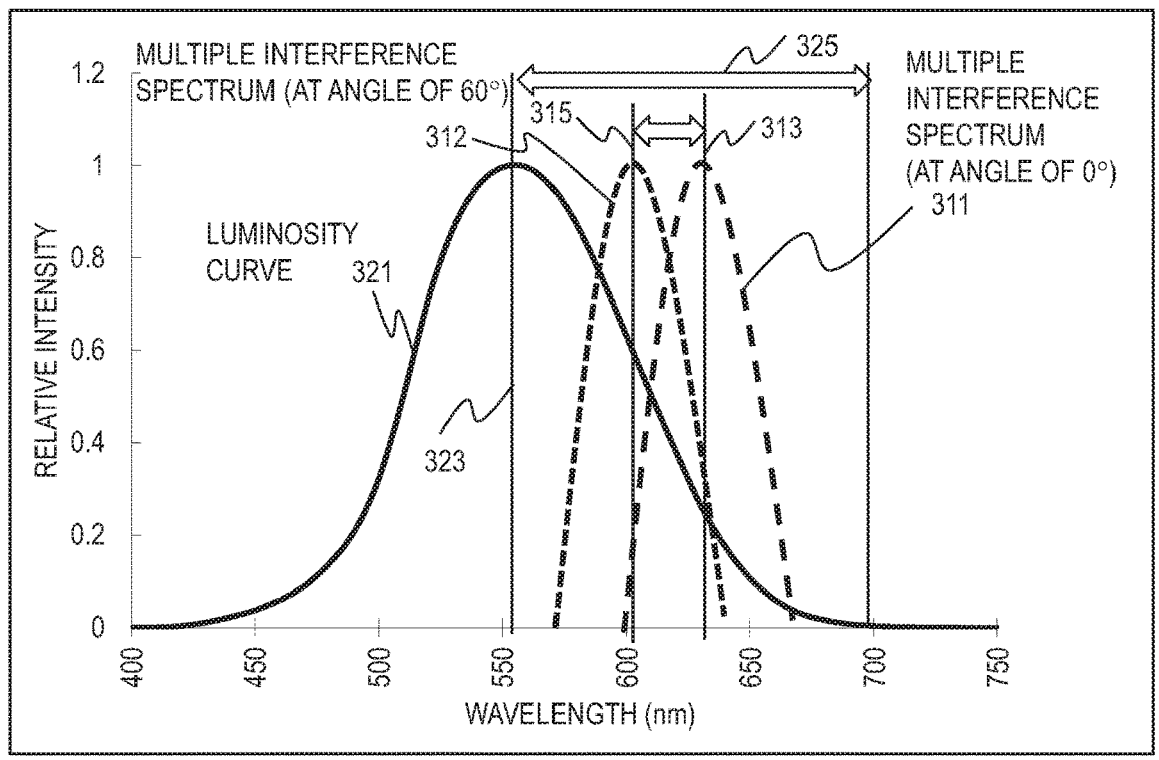
FIG. 3C is a graph indicating the relation among the luminosity curve, the multiple interference spectrum curve (at the angle of 0°), and the multiple interference spectrum curve (at the angle of 60°)

FIG. 3C is a graph indicating the relation among the luminosity curve 321, the multiple interference spectrum curve 311 (at the angle of 0°), and the multiple interference spectrum curve 312 (at the angle of 60°). The horizontal axis represents wavelength and the vertical axis represents relative intensity of the luminosity curve 321 and the multiple interference spectrum curves 311 and 312. The peak wavelengths 313 and 315 of the multiple interference spectrum curves 311 and 312 are longer than the peak wavelength 323 of the luminosity curve 321. The peak wavelengths 313 and 315 of the multiple interference spectrum curves 311 and 312 are in the wavelength range 325 where the luminosity curve 321 slopes negatively with respect to the wavelength.

Figure 3D:
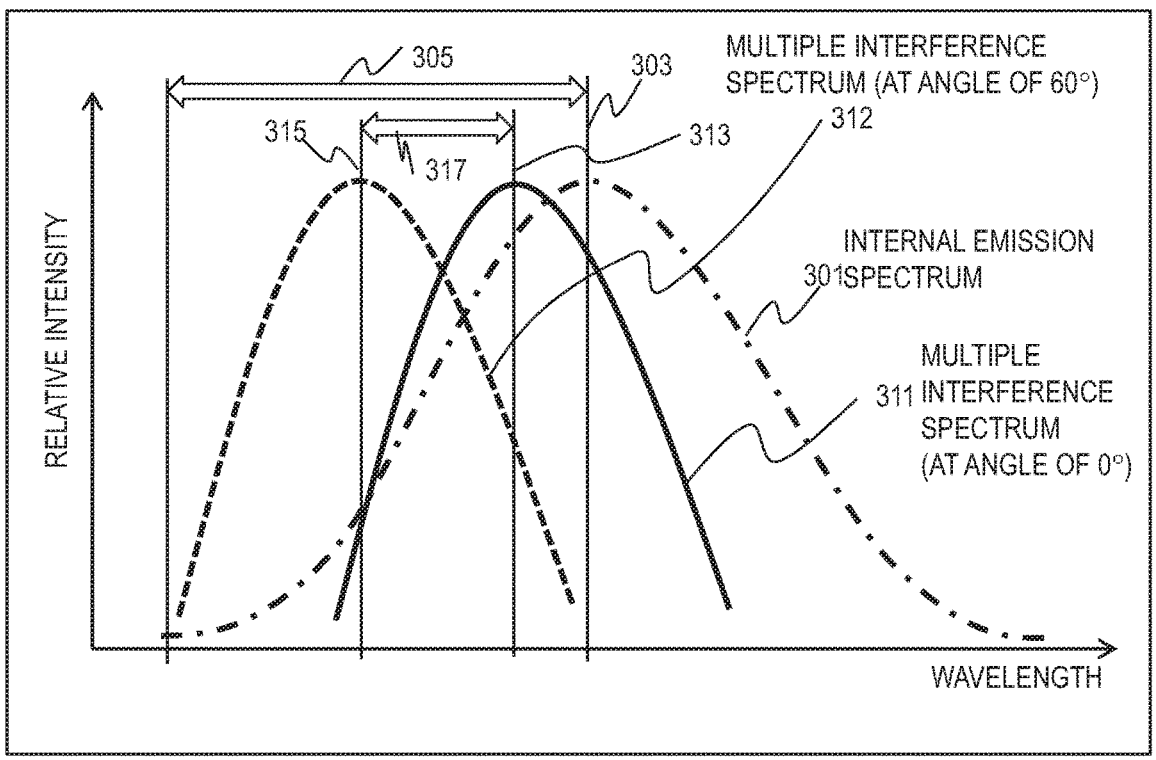
FIG. 3D is a graph indicating the relation among the internal emission spectrum curve, the multiple interference spectrum curve (at the angle of 0°), and the multiple interference spectrum curve (at the angle of 60°)

FIG. 3D is a graph indicating the relation among the internal emission spectrum curve 301, the multiple interference spectrum curve 311 (at the angle of 0°), and the multiple interference spectrum curve 312 (at the angle of 60°). The horizontal axis represents wavelength and the vertical axis represents relative intensity of the internal emission spectrum curve 301 and the multiple interference spectrum curves 311 and 312.

The peak wavelength 303 of the internal emission spectrum curve 301 is outside the wavelength range (resonant wavelength range) 317 from the peak wavelength 313 of the multiple interference spectrum curve 311 at the angle of 0° to the peak wavelength 315 of the multiple interference spectrum curve 312 at the angle of 60°. More specifically, the peak wavelength 303 of the internal emission spectrum curve 301 is longer than any wavelength in the wavelength range 317.

Figure 3E:
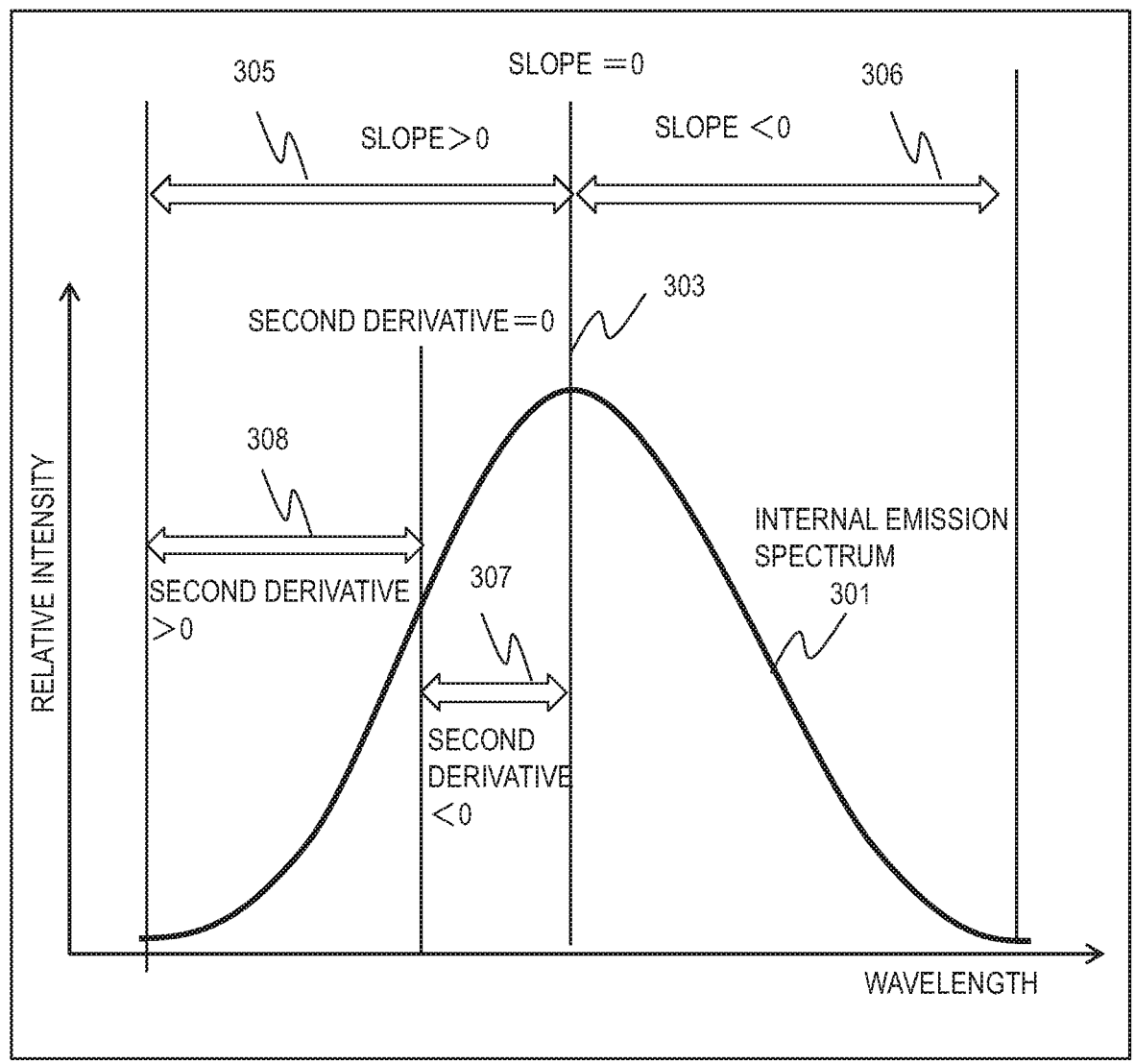
FIG. 3E is a graph for explaining the slopes of the internal emission spectrum curve.

Within the peak wavelength range 317 of the multiple interference spectrum curve, the internal emission spectrum curve 301 slopes positively (upward), in other words, the slope of the intensity with respect to the wavelength (per 1 nm) is positive. FIG. 3E is a graph for explaining the slope of the internal emission spectrum curve 301. The horizontal axis represents wavelength and the vertical axis represents relative intensity of the internal emission spectrum curve 301.

At the peak wavelength 303, the slope of the internal emission spectrum curve 301 is 0. In the wavelength range 305 shorter than the peak wavelength 303, the slope is positive. In the wavelength range 306 longer than the peak wavelength 303, the slope is negative.

The wavelength range 305 shorter than the peak wavelength 303 includes a wavelength range 307 closer to the peak wavelength 303 and a wavelength range 308 farther from the peak wavelength 303. In the wavelength range 307, the internal emission spectrum curve 301 is upward convex. In other words, the second derivative of the internal emission spectrum curve 301 is negative in the wavelength range 307.

In contrast, the internal emission spectrum curve 301 is downward-convex in the wavelength range 308. In other words, the second derivative of the internal emission spectrum curve 301 is positive in the wavelength range 308. At the boundary between the wavelength ranges 307 and 308, the internal emission spectrum curve 301 is linear; in other words, its second derivative is 0. It is preferable that the peak wavelength range 317 of the multiple interference spectrum curve in the angle range from 0° to 60° be included in the wavelength range where the second derivative of the internal emission spectrum curve 301 is not less than 0.

As indicated in FIG. 3A, in the wavelength range where the luminosity curve 321 slopes negatively with respect to the wavelength, the peak wavelength of the multiple interference spectrum shifts to a shorter wavelength, from the wavelength 313 to the wavelength 315, as the angle varies from 0° to 60°. The intensity of the luminosity curve 321 increases with the variation from the wavelength 313 to the wavelength 315. Accordingly, when the user changes the angle to see the OLED element 250, the user feels the change in luminance and chromaticity more strongly.

As described above, in the wavelength range 325 where the luminosity curve 321 slopes negatively with respect to the wavelength, the internal emission spectrum of a specific color of OLED element 250 in this embodiment has a peak wavelength 303 outside, more specifically on the longer wavelength side, of the peak wavelength range (resonant wavelength range) 317 of the multiple interference spectrum that varies in the angle range from 0° to 60°. In the peak wavelength range (resonant wavelength range) 317 of the multiple interference spectrum that varies in the angle range from 0° to 60°, the slope of the internal emission spectrum (the intensity thereof) with respect to the wavelength is always greater than 0.

In the above-described configuration, the peak wavelength of the multiple interference spectrum does not become the same as the peak wavelength of the internal emission spectrum within the angle range from 0° to 60° and the overlap between these spectra gradually reduces; accordingly, sharp variation in luminance and chromaticity is eliminated.

In an example, in the peak wavelength range 317 of the multiple interference spectrum that varies in the angle range from 0° to 60°, the internal emission spectrum curve is expressed by a downward-convex or linear function. That is to say, the value of the second derivative of the internal emission spectrum (intensity) with respect to the wavelength is always not less than 0. This configuration achieves milder variation in luminance and chromaticity with angle.

Figure 4:
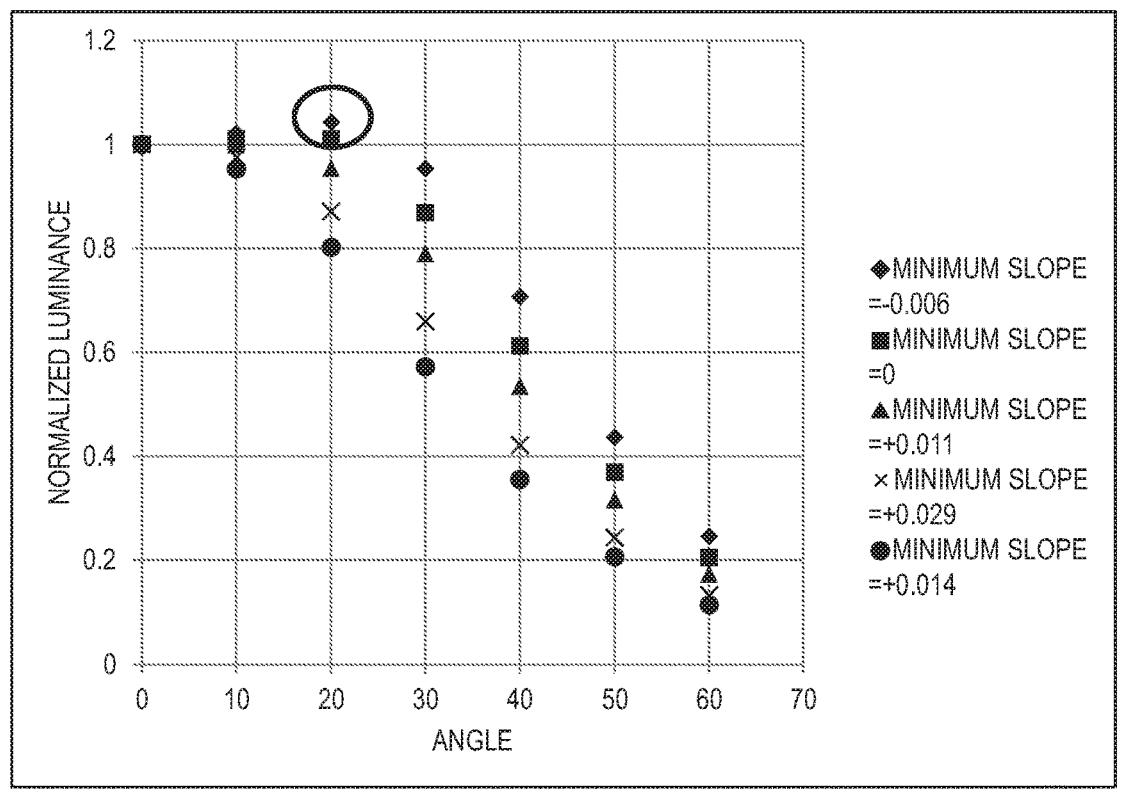
FIG. 4 is a graph providing measurement results on OLED element samples having different spectrum relations.

FIG. 4 is a graph providing measurement results on OLED element samples having different spectrum relations. In the graph of FIG. 4, the horizontal axis represents angle and the vertical axis represents normalized luminance. The normalized luminance is luminance normalized to the front luminance. The minimum slopes measured on the samples are different. A minimum slope is the smallest value in the slope of the internal emission spectrum curve within the peak wavelength range of the multiple interference spectrum in the angle range from 0° to 60°.

Regarding the sample having a minimum slope of 0, the peak wavelength of the internal emission spectrum is the same as the peak wavelength of the multiple interference spectrum at the angle of 0°. Regarding the sample having a minimum slope of a negative value, the peak wavelength of the internal emission spectrum is shorter than the peak wavelength of the multiple interference spectrum at the angle of 0°. Regarding the samples having a minimum slope of a positive value, the slopes of their internal emission spectra are always positive within the peak wavelength range of the multiple interference spectrum in the angle range from 0° to 60°, as described with reference to FIGS. 3A to 3E.

As understood from the graph of FIG. 4, the luminance of the sample having a minimum slope of 0 and the sample having a minimum slope of a negative value becomes higher than their luminance at the front (at the angle of 0°) (the normalized intensities are higher than 1) when the angle is 20° and then drops sharply. In contrast, the luminance of the samples having the minimum slope of a positive value varies gently.

In summary, when the slope of the normalized internal emission spectrum (spectrum normalized to the maximum intensity) with respect to the wavelength is always greater than 0 within the peak wavelength range of the multiple interference spectrum in the angle range from 0° to 60°, sharp variation of the luminance with angle is eliminated.

Figure 5:
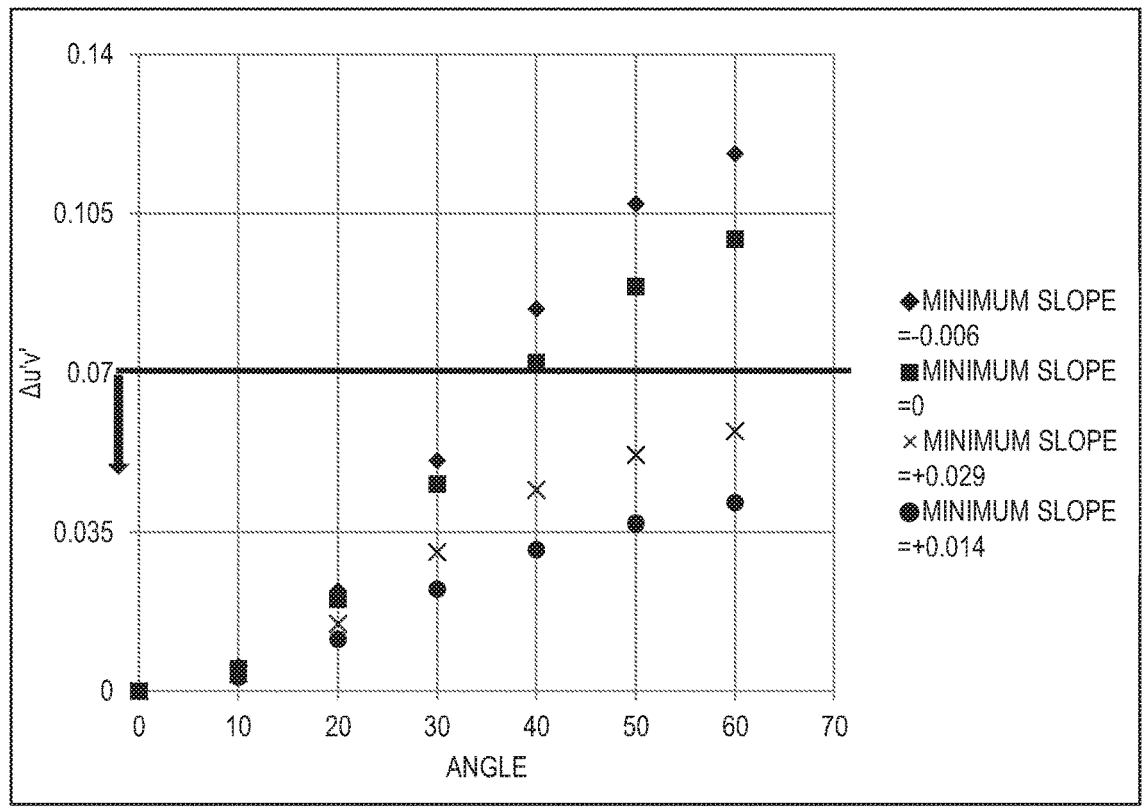
FIG. 5 is a graph providing measurement results on OLED element samples having different spectrum relations.

FIG. 5 is a graph providing measurement results on OLED element samples having different spectrum relations. In the graph of FIG. 5, the horizontal axis represents angle and the vertical axis represents chromatic change based on the u'v' chromaticity diagram. The measured samples are different in minimum slope. The minimum slope is as explained with reference to FIG. 4.

As understood from the graph of FIG. 5, the samples satisfying the following condition exhibit small variation in chromaticity with angle. The condition is that the slope of the normalized intensity of the internal emission spectrum with respect to the wavelength is always greater than 0 (the samples having a minimum slope of a positive value) in the peak wavelength range of the multiple interference spectrum in the angle range from 0° to 60°.

As indicated in the graph of FIG. 5, the values of $\Delta u'v'$ of the samples having a minimum slope of a positive value are less than 0.07 when the angle is changed from 0° to 60°. If the indicator $\Delta u'v'$ of color deviation is not more than 0.07 when the angle is changed from 0° to 60°, sharp variation in chromaticity with angle is eliminated.

Figure 6A:
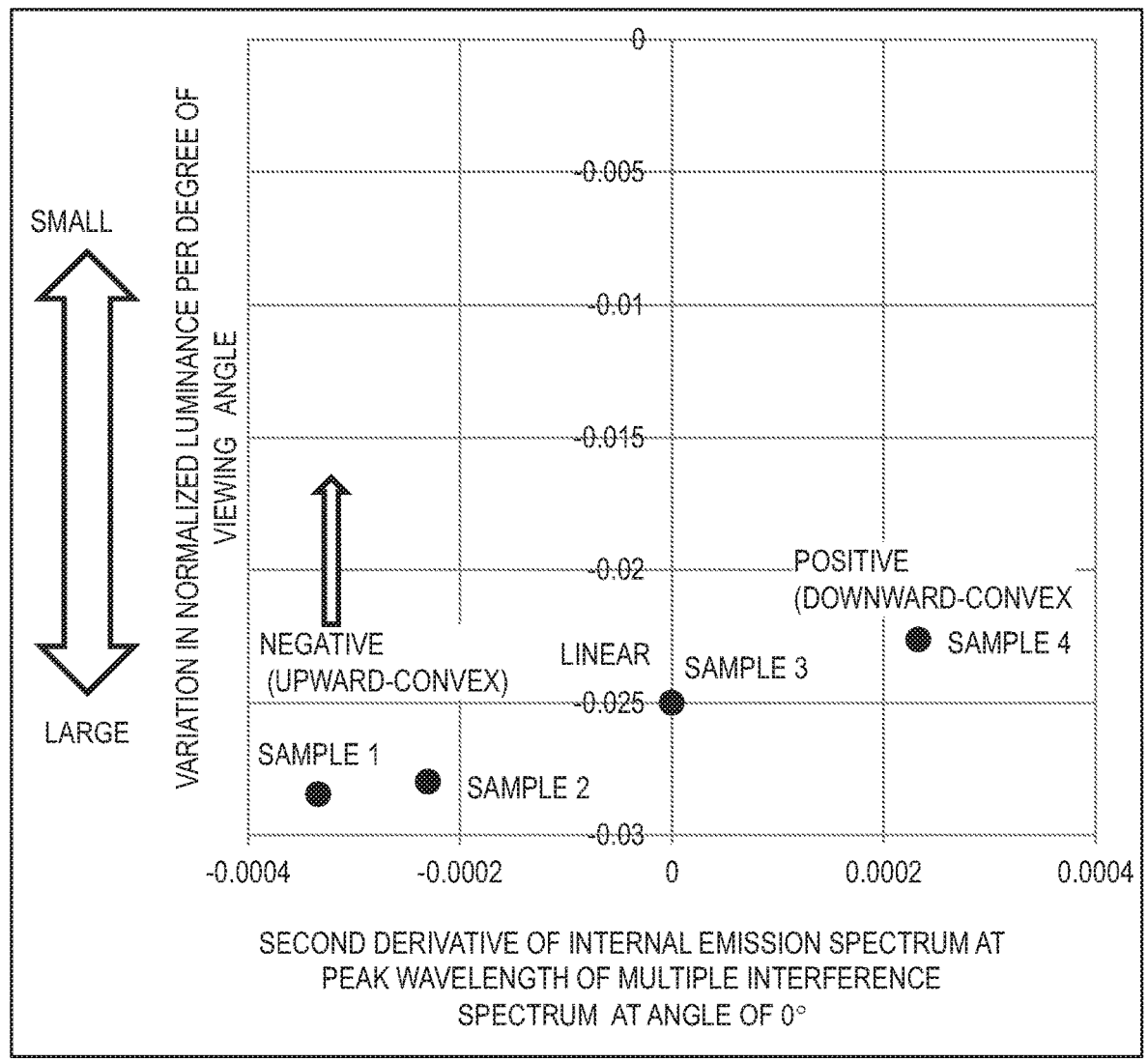
FIG. 6A is a graph providing measurement results on OLED element samples having different spectrum relations.

FIG. 6A is a graph providing measurement results on OLED element samples having different spectrum relations. In the graph of FIG. 6A, the horizontal axis represents second derivative of the internal emission spectrum at the peak wavelength of the multiple interference spectrum at the angle of 0° and the vertical axis represents the maximum variation in normalized luminance per degree of angle (the value when the normalized luminance varies most in one degree of angle) in the angle range from 0° to 60°.

The graph of FIG. 6A indicates that, in the peak wavelength range of the multiple interference spectrum in the angle range from 0° to 60°, when the second derivative of the internal emission spectrum with respect to the wavelength is not less than 0, that is, when the internal emission spectrum with respect to the wavelength is a downward-convex or linear function, the variation in normalized luminance per degree of angle with respect to the second derivative of the internal emission spectrum is significantly small, compared to the case where the second derivative of the internal emission spectrum with respect to the wavelength is smaller than 0. This teaches that the variation in luminance can be made smaller under such conditions. According to the graph of FIG. 6A, the samples having the second derivative of the internal emission spectrum with respect to the wavelength not less than 0 exhibit variation in normalized luminance per degree of angle not less than −0.025. When the variation in normalized luminance per degree of angle is not less than −0.025 and not more than 0, the variation in luminance with angle can be made smaller.

In recent years, the demand for a wider color gamut, particularly for deeper red (the wavelength between 610 nm and 700 nm), has been increasing. The same demand exists to use a plain red color as warning.

However, in the wavelength range higher than approximately 600 nm (yellow-red color), which is the peak of the color-matching function of the stimulus value X, the slopes of the color-matching functions of the stimulus values X and Y with respect to the wavelength are steep. The user feels the chromatic change depending on the angle of sight more strongly. Especially, it is noticeable around a little longer than 625 nm where the slope of the color-matching function of the stimulus value X is steep.

Accordingly, for the visible red light range where the peak wavelength of the external emission spectrum in the front is not less than 610 nm and not more than 700 nm, the above-described variation ranges of the chromaticity and the normalized luminance are effective. Particularly, they are effective for the range where the peak wavelength of the external emission spectrum in the front is not less than 625 nm and not more than 700 nm.

In summary, in the overlap range between the range where the peak wavelength of the external emission spectrum in the front is not less than 610 nm and not more than 700 nm, especially not less than 625 nm and not more than 700 nm, and the peak wavelength range 317 of the multiple interference spectrum that varies in the angle range from 0° to 60°, the internal emission spectrum curve 301 slopes positively, in other words, the slope of the intensity with respect to the wavelength (per 1 nm) is positive and further, the internal emission spectrum curve is expressed as a downward-convex or linear function. That is to say, an OLED element on which the second derivative of the internal emission spectrum (intensity) with respect to the wavelength is always not less than 0 achieves milder variation in luminance and chromaticity with output angle of light.

Furthermore, an OLED element satisfying the following conditions effectively achieves smaller variation in luminance and chromaticity with angle. The conditions are: within the range where the peak wavelength range of the external emission spectrum in the front is from 610 nm to 700 nm, especially from 625 nm to 700 nm, the indicator $\Delta u'v'$ for color deviation does not exceed 0.07 and the variation in normalized luminance per degree of angle is not less than –0.025 and not more than 0 when the angle is changed from 0° to 60°.

Figure 6B:
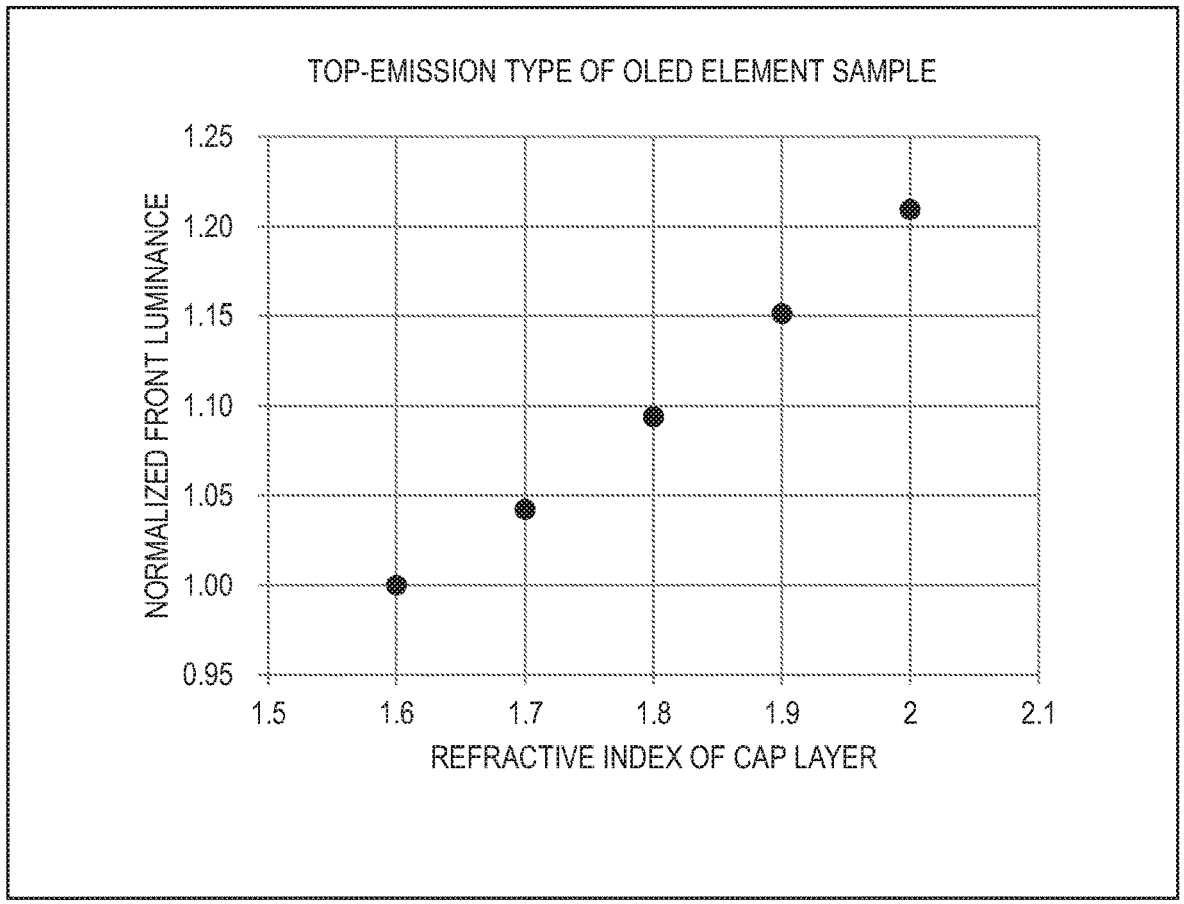
FIG. 6B provides a relation between the refractive index of a cap layer of a top-emission type of OLED element sample and the relative front luminance normalized to the front luminance of the OLED element with a cap layer having a refractive index of 1.6.

FIG. 6B provides a relation between the refractive index of a cap layer of a top-emission type of OLED element sample and the relative front luminance normalized to the front luminance of an OLED element with a cap layer having a refractive index of 1.6. As indicated in this graph, the front luminance can be increased by increasing the refractive index of the cap layer, although the change in chromaticity and luminance depending on the angle becomes large as already described.

Configuration of Pixel

In the above-described configuration of an OLED element 250, the peak wavelength of the multiple interference spectrum at the angle of 0° is different from the peak wavelength of the internal emission spectrum. When their difference is large, the front luminance of the OLED element 250 is significantly lowered. Hereinafter, a configuration to attain higher front luminance while keeping small luminance variation with angle is described.

Figure 7:
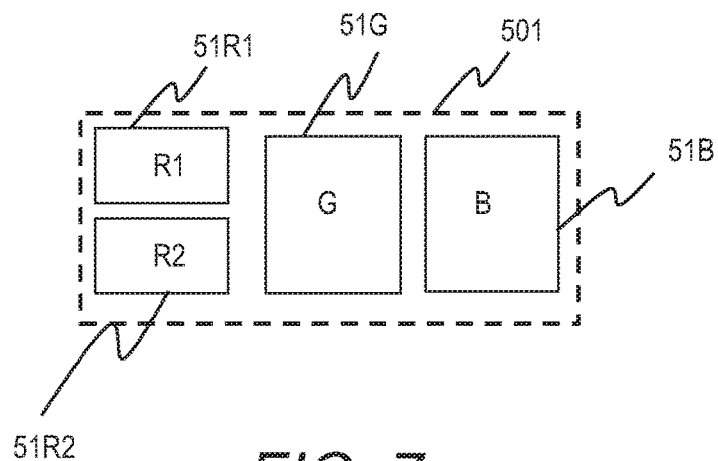
FIG. 7 schematically illustrates a configuration example of a pixel.

FIG. 7 schematically illustrates a configuration of a pixel of this example. A pixel 501 consists of two red subpixels 51R1 and 51R2, a green subpixel 51G, and a blue subpixel 51B. The light emitted from the red subpixels 51R1 and 51R2 have different wavelengths. More specifically, the red subpixels 51R1 and 51R2 have different internal emission peak wavelengths. The subpixels 51R1, 51R2, 51G, and 51B are OLED elements or the light-emitting regions of the OLED elements.

Figure 8:
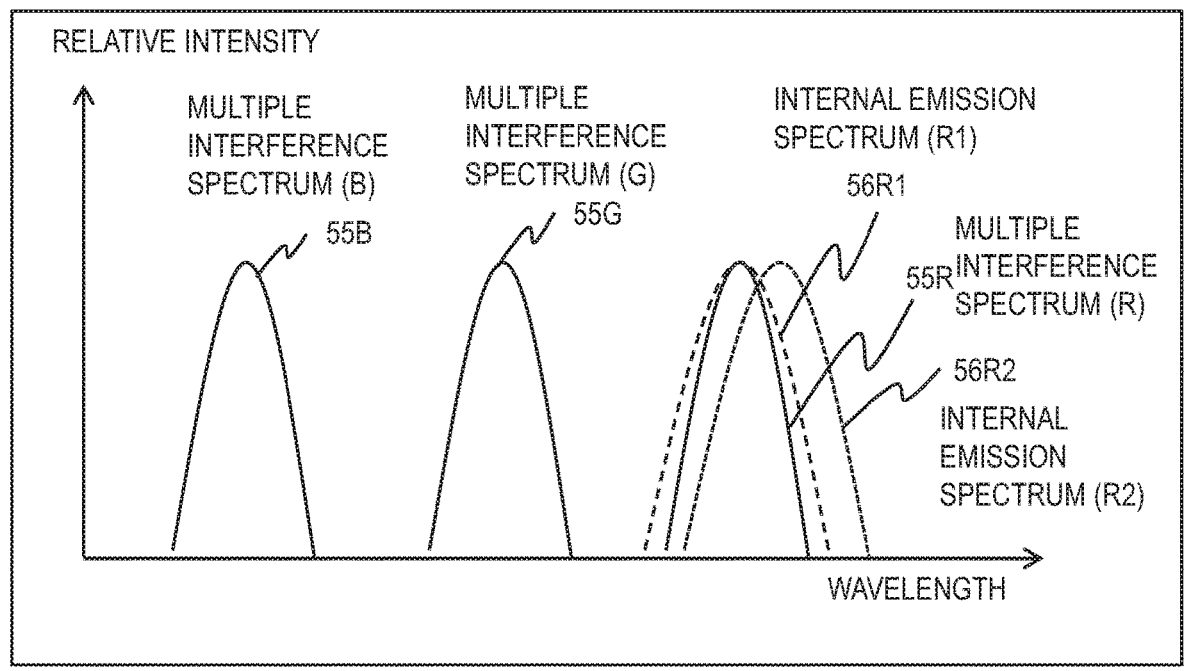
FIG. 8 provides multiple interference spectrum curves of subpixels at an angle of 0° and internal emission spectrum curves of red subpixels.

FIG. 8 provides multiple interference spectrum curves 55R, 55G, and 55B of subpixels 51R1, 51R2, 51G, and 51B at the angle of 0°, and internal emission spectrum curves 56R1 and 56R2 of the subpixels 51R1 and 51R2. In the graph of FIG. 8, the horizontal axis represents wavelength and the vertical axis represents relative intensity of each curve. The multiple interference spectrum curve 55R is common to the subpixels 51R1 and 51R2. The multiple interference spectrum curves of the subpixels 51R1 and 51R2 can be different.

The peak wavelength of the internal emission spectrum curve 56R1 of the subpixel 51R1 is shorter than the peak wavelength of the internal emission spectrum curve 56R2 of the subpixel 51R2. The peak wavelength of the internal emission spectrum curve 56R1 of the subpixel 51R1 is the same as the peak wavelength of the multiple interference spectrum curve 55R at the angle of 0°. The internal emission spectrum curve 56R2 and the multiple interference spectrum of the subpixel 51R2 have one of the relations described with reference to FIGS. 3A to 6A.

Since the peak wavelength of the internal emission spectrum curve 56R1 of the subpixel 51R1 is the same as the peak wavelength of the multiple interference spectrum curve 55R at the angle of 0°, the luminance is increased because of the microcavity effect. Accordingly, the front luminance is increased because of the subpixel 51R1 while the variation in chromaticity and luminance depending on the angle is made small because of the subpixel 51R2. The area ratio between the subpixel 51R1 and the subpixel 51R2 is determined to meet the required luminance by design.

As described above, in a pixel 501 consisting subpixels of three colors of red, green, and blue, the internal emission spectra of the subpixels 51R1 and 51R2 that emit light within the wavelength range where the luminous curve slopes negatively with respect to the wavelength have two different peak wavelengths. The peak wavelength of the internal emission spectrum of the subpixel 51R1 is the same as the peak wavelength of the multiple interference spectrum at the angle of 0°.

The peak wavelength of the internal emission spectrum of the subpixel 51R2 is outside the peak wavelength range of the multiple interference spectrum when the angle ranges from 0° to 60°. Further, in the peak wavelength range of the multiple interference spectrum when the angle ranges from 0° to 60°, the slope of the internal emission spectrum with respect to the wavelength is always greater than 0 or the internal emission spectrum curve is a downward-convex or linear function.

In another example, when the angle is changed from 0° to 60°, the indicator $\Delta u'v'$ of color deviation of the light from the subpixel 51R2 is not more than 0.07 and the variation in normalized luminance of the subpixel 51R2 per degree of angle is not less than –0.025 and not more than 0.

In an example, the luminance of the subpixel 51R2 at the angle of 0° is 70% of the luminance of the subpixel 51R1 at the angle of 0°. When the angle is changed from 0° to 60°, the indicator $\Delta u'v'$ of color deviation of the light from the subpixel 51R1 is 0.099 and the indicator $\Delta u'v'$ of color deviation of the light from the subpixel 51R2 is 0.043. When the angle is changed from 0° to 60°, the variation in normalized luminance of the subpixel 51R1 per degree of angle is –0.029 and the variation in normalized luminance of the subpixel 51R2 per degree of angle is –0.025.

In the foregoing configuration example, the peak wavelength of the internal emission spectrum curve 56R1 of the subpixel 51R1 is the same as the peak wavelength of the multiple interference spectrum curve 55R at the angle of 0°. Unlike this configuration, these peak wavelengths do not need to be the same. In that case, the difference between the peak wavelength of the multiple interference spectrum curve 55R and the peak wavelength of the internal emission spectrum curve 56R1 is smaller than the difference between the peak wavelength of the multiple interference spectrum curve 55R and the peak wavelength of the internal emission spectrum curve 56R2. Because of this configuration, the front luminance of the subpixel 51R1 becomes higher than the front luminance of the subpixel 51R2.

Regarding the subpixel 51R1, the peak wavelength of the multiple interference spectrum curve 55R can be longer than the peak wavelength of the internal emission spectrum curve 56R1; however, the variation in luminance depending on the angle can be made small by providing the peak wavelength of the multiple interference spectrum curve 55R within the wavelength range where the slope of the internal emission spectrum curve 56R1 is not less than 0, compared to the case where the peak wavelength is within the wavelength range where the slope of the internal emission spectrum curve 56R1 is negative.

Further, in view of the relation provided in FIG. 6B, the refractive index n1 of the cap layer of the subpixel 51R1 and the refractive index n2 of the cap layer of the subpixel 51R2 can be determined to satisfy the relation n1>n2. This configuration makes the front luminance of the subpixel 51R1 higher but keeps the variation in chromaticity and luminance depending on the angle small with the subpixel 51R2.

Manufacturing Method

Figure 9A:
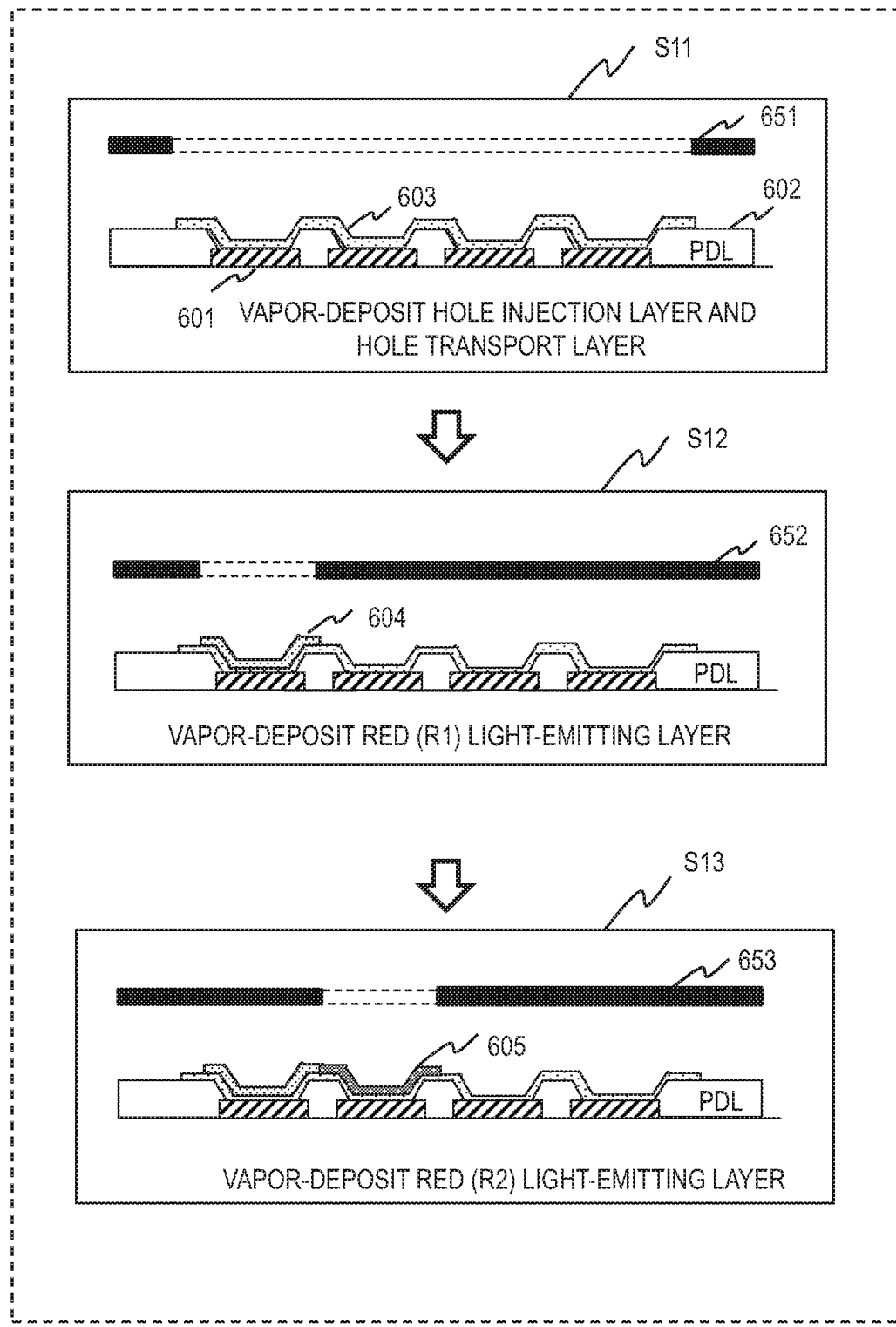
FIG. 9A illustrates steps to manufacture a red (R1) OLED element, a red (R2) OLED element, a green (G) OLED element, and a blue (B) OLED element on a substrate.
Figure 9B:
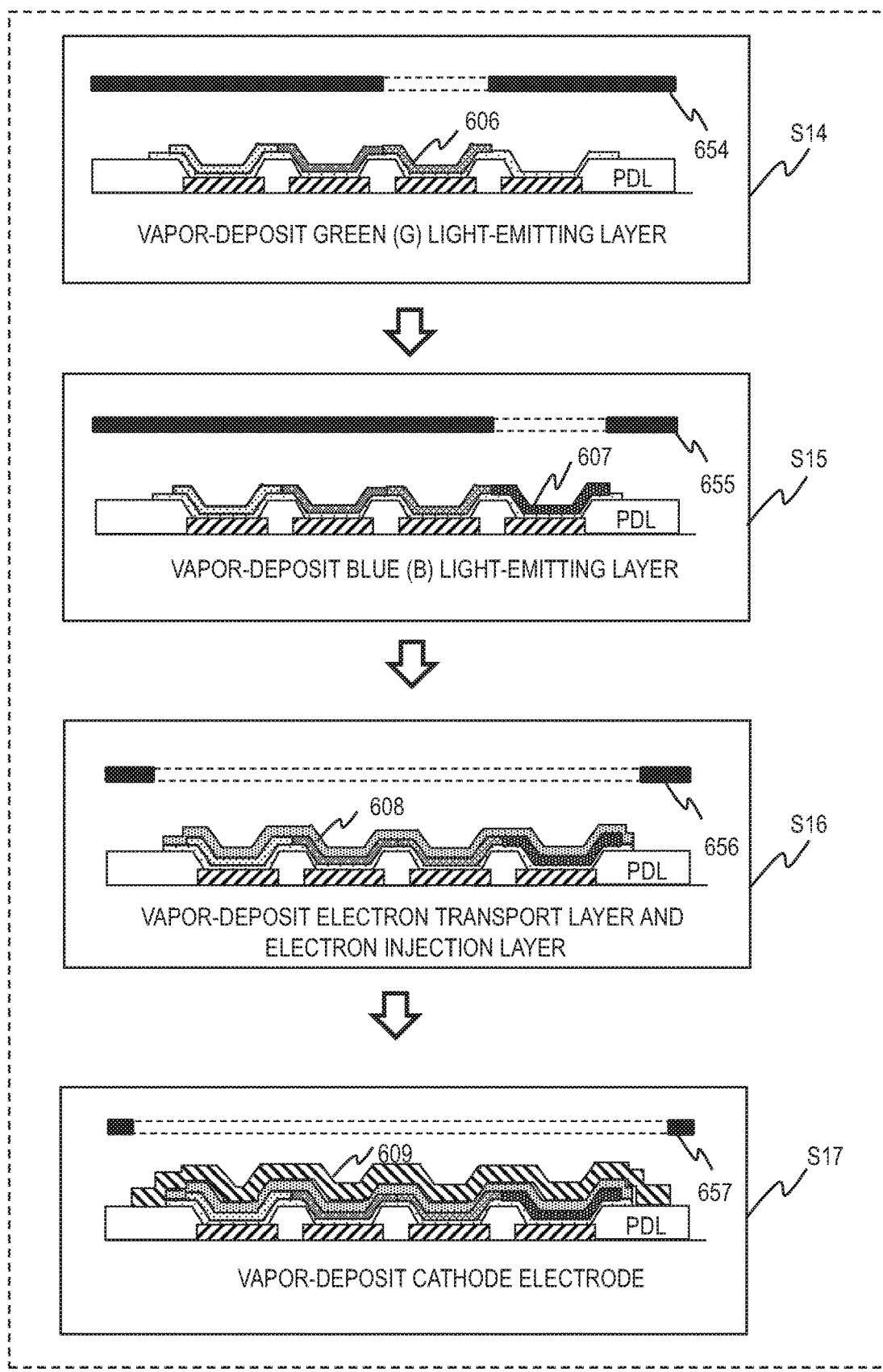
FIG. 9B illustrates further steps to manufacture a red (R1) OLED element, a red (R2) OLED element, a green (G) OLED element, and a blue (B) OLED element on a substrate.

Hereinafter, a method of manufacturing OLED elements is described. FIGS. 9A and 9B illustrate steps of manufacturing a red (R1) OLED element, another red (R2) OLED element, a green (G) OLED element, and a blue (B) OLED element on a substrate. Each step vapor-deposits the material on the substrate through a metal mask. The metal mask has openings corresponding to the regions where to vapor-deposit the material.

With reference to FIG. 9A, the manufacturing step S11 vapor-deposits a hole injection layer and a hole transport layer 603 on anode electrodes 601 and a pixel defining layer (PDL) 602 formed on an insulative substrate through a metal mask 651. The pixel defining layer 602 is a resin layer having patterns of openings: an anode electrode 601 is exposed through each opening.

The manufacturing step S12 vapor-deposits a red (R1) light-emitting layer 604 on the anode electrode for a subpixel 51R1 through a metal mask 652. The manufacturing step S13 vapor-deposits a red (R2) light-emitting layer 605 on the anode electrode for a subpixel 51R2 through a metal mask 653.

With reference to FIG. 9B, the manufacturing step S14 vapor-deposits a green light-emitting layer 606 on the anode electrode for a subpixel 51G through a metal mask 654. The manufacturing step S15 vapor-deposits a blue light-emitting layer 607 on the anode electrode for a subpixel 51B through a metal mask 655. The order of formation of the light-emitting layers 604 to 607 can be determined desirably.

The manufacturing step S16 vapor-deposits an electron transport layer and an electron injection layer 608 to cover all OLED elements (the entire display region) through a metal mask 656. The manufacturing step S17 vapor-deposits a cathode electrode 609 to cover all OLED elements (the entire display region) through a metal mask 657.

Depending on the design, the method further vapor-deposits a cap layer for the subpixel 51R1 on the cathode electrode through a metal mask and then vapor-deposits a cap layer for the subpixels 51R2, 51G, and 51B through a metal mask.

In the foregoing manufacturing steps, the material for the light-emitting layers 604 and 605 of the subpixels 51R1 and 51R2 and the thicknesses of the organic films between the anode electrodes 601 for the subpixels 51R1 and 51R2 and the cathode electrode 609 are designed to satisfy the conditions described with reference to FIG. 8.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
   a substrate; and
   a plurality of first light-emitting elements, each of the plurality of first light-emitting elements being a microcavity structure including:
   a first light-emitting film, and
   a first upper electrode and a first lower electrode sandwiching the first light-emitting film, an optical distance between the first upper electrode and the first lower electrode being an optical distance that selectively resonates and amplifies light having a specific wavelength,
   wherein each of the first light-emitting elements has an external emission spectrum that is a visible red spectrum extracted from the respective first light-emitting elements, the external emission spectrum being determined by multiplying an internal emission spectrum of the respective first light-emitting film with a multiple interference spectrum that is a spectrum of light affected by multiple interference effects in the respective first light-emitting elements,
   a peak wavelength of the internal emission spectrum of the respective first light-emitting film is in a wavelength range in which a luminosity curve slopes negatively, the peak wavelength of the internal emission spectrum being longer than a peak wavelength of the luminosity curve, the luminosity curve being the standard for spectral sensitivity of the average human eye,
   a wavelength range of a peak wavelength of the multiple interference spectrum that varies within a viewing angle of 0° to 60° with respect to a normal direction of the substrate set at 0° is in a wavelength range shorter than the peak wavelength of the internal emission spectrum of the first light-emitting film where the internal emission spectrum of the first light-emitting film slopes positively,
   a second derivative of the internal emission spectrum of the respective first light-emitting film has a value not less than 0 within the wavelength range where the peak wavelength of the multiple interference spectrum caused by the microcavity structure varies at the viewing angle from 0° to 60°, and
   each of the first light-emitting elements generates a peak wavelength of the external emission spectrum in a range from 625 nm to 700 nm at the viewing angle of 0°.

2. The display device according to claim 1, further comprising a plurality of second light-emitting elements, each of the plurality of second light-emitting elements including:
   a second light-emitting film, and
   a second upper electrode and a second lower electrode sandwiching the second light-emitting film, an optical distance between the second upper electrode and the second lower electrode being an optical distance that selectively resonates and amplifies light having a specific wavelength,
   wherein each of the second light-emitting elements has an external emission spectrum that is a visible red spectrum extracted from the respective second light-emitting element, the external emission spectrum being determined by multiplying an internal emission spectrum of the respective first light-emitting film with a multiple interference spectrum that is a spectrum of light affected by multiple interference effects in the microcavity structure of the respective second light-emitting elements, and wherein the difference between the peak wavelength of the internal emission spectrum of the second light-emitting film and the peak wavelength of the multiple interference spectrum caused by the microcavity structure of the one second light-emitting element is smaller than the difference between the peak wavelength of the internal emission spectrum of the first light-emitting film and the peak wavelength of the multiple interference spectrum at the viewing angle of 0°.

3. The display device according to claim 2, wherein the peak wavelength of the multiple interference spectrum of the one second light-emitting element is within a wavelength range where a slope of the emission spectrum of the second light-emitting film is not less than 0 at the viewing angle of 0°.

4. The display device according to claim 2, wherein the peak wavelength of the emission spectrum of the second light-emitting film is the same as the peak wavelength of the multiple interference spectrum caused by the microcavity structure of the one second light-emitting element at the viewing angle of 0°.

5. The display device according to claim 2, further comprising a cap layer of the one first light-emitting element and a cap layer of the one second light-emitting element, wherein a relation n2>n1 is satisfied, where n1 represents a refractive index of a cap layer of the one first light-emitting element and n2 represents a refractive index of a cap layer of the one second light-emitting element.

6. A display device comprising:
a substrate; and
a plurality of first light-emitting elements, each of the plurality of first light-emitting elements being a microcavity structure including:
  a first light-emitting film, and
  a first upper electrode and a first lower electrode sandwiching the first light-emitting film, an optical distance between the first upper electrode and the first lower electrode being an optical distance that selectively resonates and amplifies light having a specific wavelength,
wherein a first one of the light-emitting elements is configured to output light having an external emission spectrum, Δu'v' in a u'v' chromaticity diagram of the external emission spectrum relative to a viewing angle in a direction normal to the first lower electrode taking a value not more than 0.07, and a variation in normalized luminance per degree of viewing angle in the external emission spectrum being not less than −0.025 and not more than 0, within a wavelength range in which a peak wavelength of the internal emission spectrum of the respective first light-emitting film is in a wavelength range in which a luminosity curve slopes negatively, the peak wavelength of the internal emission spectrum being longer than a peak wavelength of the luminosity curve, the luminosity curve being the standard for spectral sensitivity of the naked average human eye,
a wavelength range of a peak wavelength of a multiple interference spectrum that varies within a viewing angle of 0° to 60° with respect to a normal direction of the substrate set at 0° is in a wavelength range shorter than the peak wavelength of the internal emission spectrum of the first light-emitting film where the internal emission spectrum of the first light-emitting film slopes positively, the external emission spectrum being a visible red spectrum extracted from the first one of the light-emitting elements, the external emission spectrum being determined by multiplying the internal emission spectrum of the first light-emitting film with the multiple interference spectrum that is a spectrum of light affected by multiple interference effects in the microcavity structure of the first one of the light-emitting elements, a second derivative of the internal emission spectrum of the respective first light-emitting film has a value not less than 0 within the wavelength range where the peak wavelength of the multiple interference spectrum caused by the microcavity structure varies at the viewing angle from 0° to 60°, and each of the first light-emitting elements generates a peak wavelength of the external emission spectrum in a range from 625 nm to 700 nm at the viewing angle of 0°.

7. The display device according to claim 6, further comprising a plurality of second light-emitting elements, each of the plurality of second light-emitting elements including:
a second light-emitting film, and
a second upper electrode and a second lower electrode sandwiching the second light-emitting film, an optical distance between the second upper electrode and the second lower electrode being an optical distance that selectively resonates and amplifies light having a specific wavelength,
wherein each of the second light-emitting elements has an external emission spectrum that is a visible red spectrum extracted from the respective second light-emitting element, the external emission spectrum being determined by multiplying an internal emission spectrum of the respective first light-emitting film with a multiple interference spectrum that is a spectrum of light affected by multiple interference effects in the microcavity structure of the respective second light-emitting elements, and
wherein the difference between the peak wavelength of the internal emission spectrum of the second light-emitting film and the peak wavelength of the multiple interference spectrum caused by the microcavity structure of the one second light-emitting element is smaller than the difference between the peak wavelength of the internal emission spectrum of the first light-emitting film and the peak wavelength of the multiple interference spectrum at the viewing angle of 0°.

8. The display device according to claim 7, wherein the peak wavelength of the multiple interference spectrum caused by the microcavity structure of the one second light-emitting element is within a wavelength range where the slope of the internal emission spectrum of the second light-emitting film is not less than 0 at the viewing angle of 0°.

9. The display device according to claim 7, wherein the peak wavelength of the internal emission spectrum of the second light-emitting film is the same as the peak wavelength of the multiple interference spectrum of the one second light-emitting element at the viewing angle of 0°.

10. The display device according to claim 7, wherein a relation n2>n1 is satisfied, where n1 represents a refractive index of a cap layer of the one first light-emitting element and n2 represents a refractive index of a cap layer of the one second light-emitting element.

\* \* \* \* \*